United States Patent [19]

Richardson

[11] Patent Number: 4,721,909

[45] Date of Patent: Jan. 26, 1988

[54] APPARATUS FOR PULSING ELECTRON BEAMS

[75] Inventor: Neil Richardson, Mountain View, Calif.

[73] Assignee: Schlumberger Technology Corporation, Palo Alto, Calif.

[21] Appl. No.: 828,157

[22] Filed: Feb. 10, 1986

Related U.S. Application Data

[63] Continuation-in-part of Ser. No. 766,905, Aug. 16, 1985.

[51] Int. Cl.$^4$ ............................................. H01J 37/147
[52] U.S. Cl. ............................ 324/158 R; 250/396 R; 313/421
[58] Field of Search ............ 324/158 R, 73 R, 158 D, 324/158 P, 71.3; 250/310, 311, 396 R, 492.2; 313/421

[56] References Cited

U.S. PATENT DOCUMENTS

| | | |
|---|---|---|
| 3,628,012 | 12/1971 | Plows et al. |
| 3,646,344 | 2/1972 | Plows et al. |
| 4,068,146 | 1/1978 | McKeown et al. ............ 313/421 X |
| 4,169,244 | 9/1979 | Plows . |
| 4,434,371 | 2/1984 | Knauer ........................ 250/396 R |
| 4,508,967 | 4/1985 | Boissel et al. ................ 250/310 X |

OTHER PUBLICATIONS

Oatley, C. W. et al., Advance. in Electronics & Electron Physics, vol. 21 (1965), pp. 182-247, Academic Press, Inc., New York, Scanning Electron Microscopy.
Kruit, P. et al., J. Phys. E: Sci. Instrum., vol. 16, "Magnetic Field Paralleliser for 2-$\pi$Electron-Spectrometer and Electron-Image Magnifier", pp. 313-324.

Primary Examiner—Reinhard J. Eisenzopf
Assistant Examiner—Stephen M. Baker
Attorney, Agent, or Firm—Fitch, Even, Tabin & Flannery

[57] ABSTRACT

An apparatus for pulsing an electron beam in an electron beam test probe used for examining integrated circuits is disclosed. The apparatus includes a structure having two intersecting channels cut therein. The electron beam passes through a first one of these channels enroute to the integrated circuit being tested. A linear conductor is disposed along the axis of the second channel such that the combination of said conductor and said second channel forms a coaxial transmission line. An electric field is generated in the second channel by applying a suitable potential between the linear conductor and the second channel. This electric field extends into the first channel from the region common to both channels. When a suitable potential is applied between the linear conductor and the second channel, the electric field generated deflects the electrons traveling in the first channel sufficiently to cause said electrons to miss an aperture through which said electrons must pass to reach the circuit being analyzed.

6 Claims, 3 Drawing Figures

APPARATUS FOR PULSING ELECTRON BEAMS

This application is a continuation-in-part of my co-pending application entitled "An Improved Electron Beam Test Probe for Integrated Circuit Testing", U.S. Ser. No. 766,905, filed Aug. 16, 1985.

BACKGROUND OF THE INVENTION

The present invention relates generally to the field of scanning electron microscopes used as test probes for visualizing and testing integrated circuits and more particularly to an improved apparatus and method for using said test probes in a stroboscopic mode.

As a result of the progress in the design and fabrication of integrated circuits, it has become possible to create circuits having millions of conductors and transistors in which the individual conductors and nodes are of the order of one to two microns. These circuits are too small and complex to be amenable to testing and analysis by techniques using mechanical probes. The mechanical probes tend to capacitively load the circuits under test thus altering the behavior one wishes to measure. Further, the mechanical probes may actually physically damage the minute conductors and nodes with which they come in contact. Finally, the number of nodes which must be examined to debug a VLSI integrated circuit is rapidly becoming too large to be amenable to manual measurement one node at a time. As a result, test probes based on electron beams have been developed. These test probes provide a means for measuring the potential on minute conductors as well as a means for forming an image of the conductors and the surrounding circuitry without any physical damage thereto.

Such an electron beam test probe is described in the above mentioned co-pending application which is hereby incorporated by reference. In general, electron beam test probe systems measure the potential at a specified point on the surface of the integrated circuit by sensing the energy distribution of the secondary electrons produced when the point in question is bombarded by electrons. The electron beam test probe system includes a means for generating an electron beam which may be directed at any point within a specified region on the integrated circuit surface. The interaction of this electron beam with the surface of the integrated circuit results in the production of secondary electrons whose energy distribution is related to the potential on the surface of the integrated circuit at the point in question. These secondary electrons are collected and the fraction of them with energies greater than a predetermined energy is determined by detecting the number of secondary electrons which have sufficient energy to overcome a potential barrier and reach an electron detector.

Since a finite time interval is required to collect sufficient secondary electrons to provide a statistically significant measurement of the potential on the surface of the integrated circuit, the potential actually measured is the average of potential over the time interval in question. This time interval is often too long to accurately measure the rapidly changing potentials which are present when a rapidly changing test signal pattern is applied to the integrated circuit under test. To avoid this problem, the electron beam test probe must be run in a stroboscopic mode which requires that the electron beam be turned on for a very short time interval at a precise time relative to the start of each cycle of a repetitive test signal pattern.

The prior art apparatus for pulsing the electron beam consists typically of a beam aperture and a pair of blanking electrodes. The electron beam must pass through the beam aperture to reach the integrated circuit being tested. When a potential is applied to the blanking electrodes, the electron beam is deflected in a manner which causes it to miss the aperture. The prior art blanking electrodes are typically a pair of deflection plates between which the electron beam passes before reaching the aperture.

The shortest time in which the electron beam may be turned on and off depends on the rise time of the potential applied to the blanking electrodes, the magnitude of said potential, and the length and separation of the blanking electrodes. The magnitude of the potential which must be applied to the blanking electrodes to sufficiently deflect the electron beam so that it will miss the aperture depends on the separation and length of the blanking electrodes. In general, large potentials are to be avoided, since it is more difficult to produce a large potential change with a short rise time. Hence, one must either use long blanking electrodes or place them close together. However, long blanking electrodes are also to be avoided, since the minimum time in which the electron beam may be turned on and off is proportional to the length of the blanking electrodes. Consequently, prior art systems are forced to use very small blanking electrodes which are separated by a very small distance. This results in significant problems in both aligning the blanking electrodes relative to the electron beam and in mounting the blanking electrodes on the apparatus in which the electron beam is generated.

In addition, the blanking electrodes have a finite capacitance which must be driven by the circuit which provides the blanking potential. At the high electron beam stroboscopic frequencies needed to analyze modern integrated circuits, this parasitic capacitance makes it difficult to impedance match the blanking electrodes to the signal generator used to supply the blanking potential.

Finally, the short duration of the electron beam pulse needed to analyze circuits running at high frequencies makes the generation of the blanking potential difficult. Electron beam pulses having durations of less than 100 picoseconds are often needed. It is difficult to generate blanking potential pules with rise times less than 100 picoseconds. Prior art systems have attempted to solve this problem by sweeping the electron beam across a small aperture such that the size of the aperture and the sweep speed determine the duration of the electron beam pulse. Although this type of system allows a blanking potential with a much slower rise time to be used, it requires a second set of deflection electrodes which are used to prevent the electron beam from sweeping through the aperture as the electron beam returns to its original position in preparation for the next electron beam pulse.

Broadly, it is an object of the present invention to provide an improved blanking electrode system for use in electron beam test probe systems.

It is another object of the present invention to provide a blanking electrode system which significantly reduces the alignment problems inherent in prior art blanking electrode systems.

It is a further object of the present invention to provide blanking electrodes which may be easily matched to the impedance of the signal generating circuit used to drive said blanking electrodes.

It is a still further object of the present invention to provide a blanking electrode system which can produce very short duration electron beam pulses without requiring a second set of deflection electrodes.

These and other objects of the present invention will become apparent from the following detailed description of the present invention invention and the accompanying drawings.

SUMMARY OF THE INVENTION

The present invention consists of an apparatus for pulsing an electron beam in an electron beam test probe used for examining integrated circuits. The apparatus includes a structure having two intersecting channels cut therein. The electron beam passes through a first one of these channels enroute to the integrated circuit being tested. A linear conductor is disposed along the axis of the second channel such that the combination of said conductor and said second channel forms a coaxial transmission line. An electric field is generated in the second channel by applying a suitable potential between the linear conductor and the second channel. This electric field extends into the first channel from the region common to both channels. When a suitable potential is applied between the linear conductor and the second channel, the electric field generated deflects the electrons traveling in the first channel sufficiently to cause said electrons to miss an aperture through which said electrons must pass to reach the circuit being analyzed.

BRIEF DESCRIPTION OF THE DRAWINGS

FIG. 2(b) is an end view of the apparatus illustrated in FIG. 2(a).

DETAILED DESCRIPTION OF THE INVENTION

Figure 1:
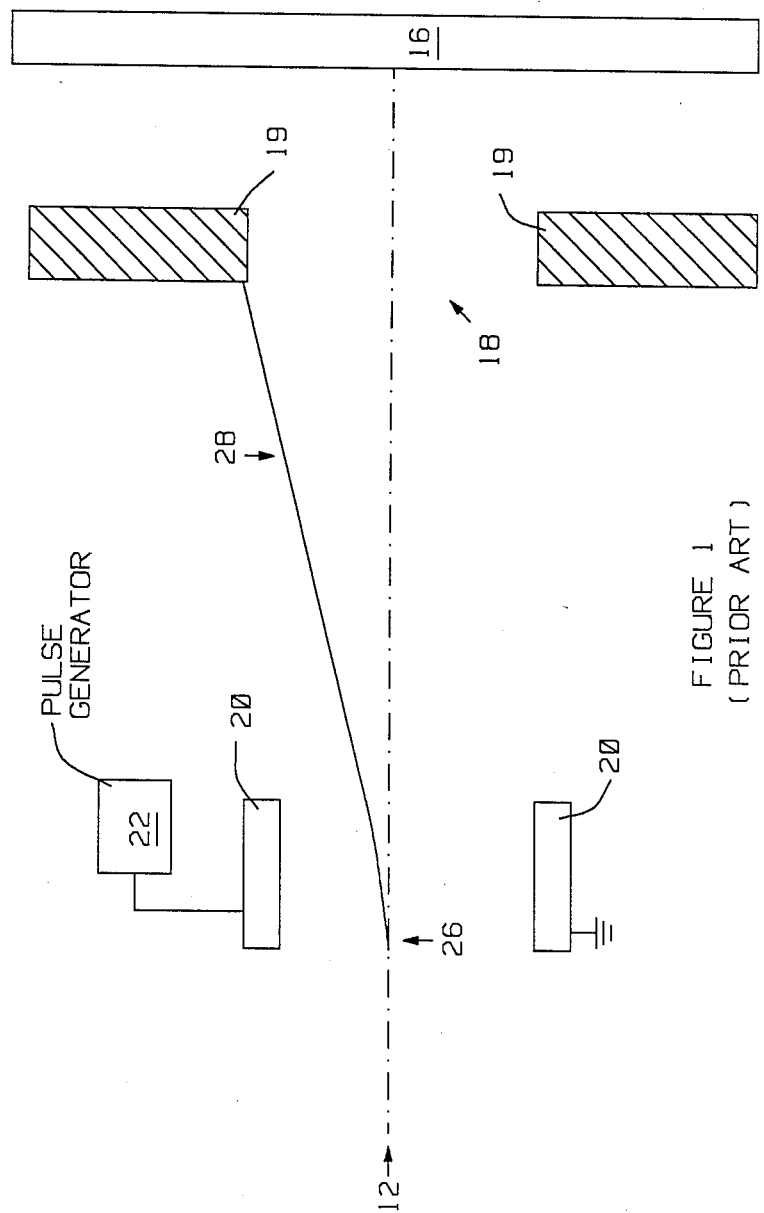
FIG. 1 illustrates the operation of a typical prior art blanking electrode system.

The apparatus of the present invention may be best understood with reference to a typical prior art blanking system which is shown in FIG. 1 at 10. The electron beam 12 produced in the electron beam test probe is directed along an axis 14 toward a circuit 16. To reach the specimen 16, the electron beam 12 must pass through an aperture 18 in a structure 19. Prior to passing through aperture 18, the electron beam passes between two blanking electrodes 20 which are typically in the form of two parallel plates. One of the blanking electrodes 20 is typically held at ground potential and the other is connected to a pulse generator 22 which is synchronized with the test signal pattern that is applied to the circuit 16 being analyzed. When a potential is applied across the blanking electrodes 20, the electron beam 12 is deflected along a path 24 which causes it to miss the aperture 18.

An electron entering these prior art blanking electrodes at 26 after a potential is applied to the blanking electrodes will be deflected through an angle 28 which is proportional to $$L \times V / D,$$

where L is the length of the blanking electrodes 20, D is the distance between the blanking electrodes 20, and V is the potential applied to the blanking electrodes 20. The electron beam can not be turned off in less time than it takes to switch a potential onto the blanking electrodes 20 sufficient to produce a deflection that will cause the electron beam 12 to miss the aperture 18. Hence, the rise time of the potential applied to the blanking electrodes 20 may limit the length of the shortest electron beam pulse which may be applied to the circuit 16. Two factors affect this rise time, the parasitic capacitance of the blanking electrodes 20 and the magnitude of the potential applied to the blanking electrodes. Since it is easier to produce low voltage fast rise time pulses than high voltage pulses of the same rise time, it is desirable to minimize the potential needed to switch the electron beam on and off. If one wishes to reduce V, either the length of the blanking electrodes 20 must be increased or the distance between them must be decreased. Both of these changes result in increases in the capacitance of the blanking electrodes. At very high frequencies, i.e., short pulse rise times, this capacitance may result in impedance mismatching between the pulse generator 22 and the blanking electrodes 20. Such mismatches may limit the rise time of the potential on the blanking electrodes or result in signal artifacts which adversely affect the wave form applied to the blanking electrodes.

Although increasing the length of the blanking electrodes 20 reduces the potential needed to deflect the electron beam, and hence would seem desireable, other factors dictate that the length of the blanking electrodes 20 be made as small as possible. One may not significantly improve the rise time of the electron beam pulse applied to the circuit by increasing the length of the blanking electrodes 20, since the transit time of an electron through the blanking electrodes 20 also places a limit on the shortest time in which the electron beam may be turned off and on. Consider an electron which has partially traversed the path between the blanking electrodes 20 when the potential is applied to the blanking electrodes. This electron will undergo a deflection which is proportional to the ratio of the remaining distance it must travel in the blanking electrodes, not the length of the blanking electrodes. Hence, it will only undergo a partial deflection which may or may not be sufficient to cause it to miss the aperture 18, depending upon its position relative to the beginning of the blanking electrodes and its lateral position relative to the electron beam axis 14. To minimize this contribution to the rise time of the electron beam pulse applied to the circuit 16, the length of the blanking electrodes 20 must be minimized.

Hence, in the prior art blanking systems, one is forced to reduce the distance, D, between the blanking electrodes 20 if one wishes to produce short electron beam pulses at low potentials on the blanking electrodes 20. This leads to significant alignment problems and to impedance mismatching between the blanking electrodes and the pulse generator 22. As the length of the blanking electrodes and their separation are both reduced, it becomes difficult to properly align the blanking electrodes with respect to the electron beam axis 14 without the aid of one or more micrometer adjustments means in the alignment system. Such adjustment means significantly increase the cost of the electron beam test probe system. Furthermore, as the distance is reduced, the parasitic capacitance of the blanking electrodes becomes significant leading to the impedance mismatch problems discussed above.

Figure 2A:
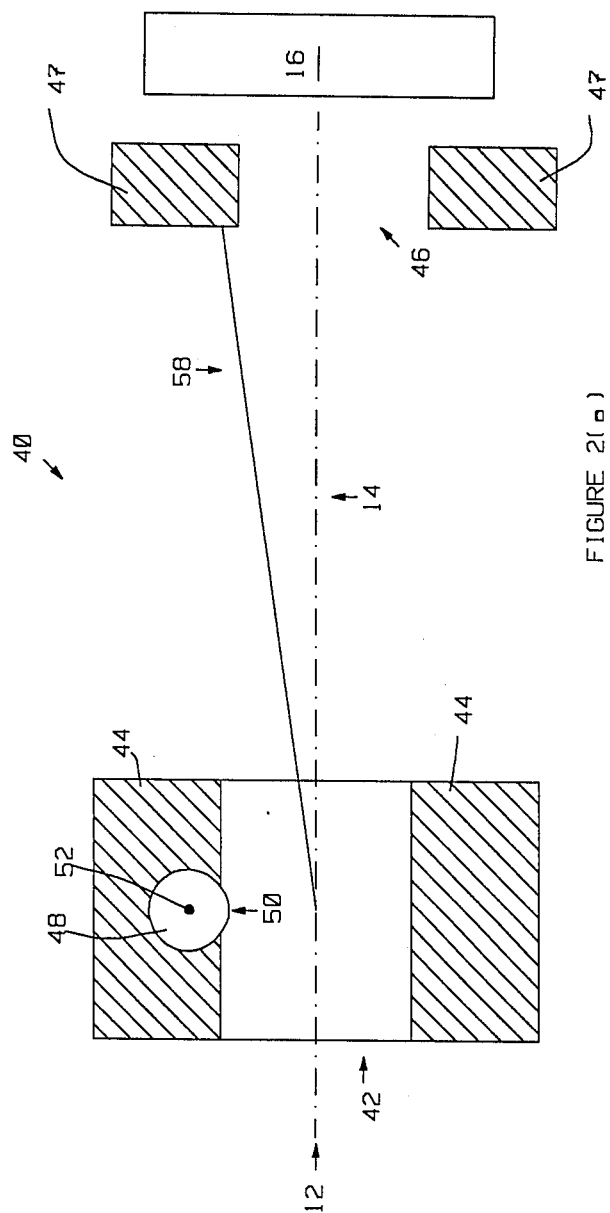
FIG. 2(a) is a cross-sectional view of an electron beam pulsing apparatus according to the present invention.

The apparatus of the present invention for producing a pulsed electron beam is shown at 40 in FIG. 2(a) and 2(b). This apparatus avoids both of the above described problems. According to the present invention, the electron beam 12 passes through a beam channel 42 in a structure 44 which is preferably of a conducting material such as copper. The beam channel 42 is preferably cylindrical. The structure 44 includes a second cylindrical channel 48 which intersects the beam channel 42 at a substantially right angle forming an area 50 which is common to both channels. The second channel 48 has a circular cross-section in the preferred embodiment. A linear conductor 52 is suspended along the axis of the second channel 48 by insulating spacers 54, shown in FIG. 2(b), so that the combination of the linear conductor 52 and the conducting walls of the second channel 48 form a coaxial transmission line. When a potential is applied between the structure 44 and the linear conductor 52, the electric field generated in interior of the second channel 48 will extend into the beam channel 42 from the region 50 common to both channels. When a sufficient potential is so applied, the electron beam 12 will be deflected along a path 58 and hence miss an aperture 46 in a structure 47 through which it must pass to strike the circuit 16 being analyzed. To avoid collisions between the linear conductor 52 and the electrons in the electron beam, the channels must intersect such that the linear conductor 52 does not pass though the beam channel 42. This will be the case if the axis of the second channel 48 does not intersect the beam channel 42.

Since the combination of the second channel 48 and the linear conductor 52 form a coaxial transmission line, the impedance mismatch problems inherent in the prior art blanking electrode systems are avoided. The potential is applied between one end of the linear conductor and the channel wall using a signal generator. The other end of the transmission line is terminated in the characteristic impedance of the transmission line. It will be apparent to those skilled in the art that such a terminated transmission line is "invisible" to the signal generator; hence no impedance mismatch will occur if the signal generator has an output impedance which matches the impedance of the transmission line formed by the linear conductor 52 and the second channel 48.

It should be noted that the difficulties encountered in prior art designs with respect to aligning the blanking electrodes with respect to the electron beam axis are significantly reduced by the present invention. In the preferred embodiment, the two channels 42 and 48 are drilled in the same structure 44 and hence are inherently positioned with respect to one another. Prior art designs require that at least one of the blanking electrodes be mounted on an insulator which in turn must be mounted on some structure which was aligned with the electron beam axis 14. This made such inherent self-alignment difficult.

In the preferred embodiment, the structure 44 is made from a conducting material. However, it will be apparent to those skilled in the art that a non-conducting material may be used provided the inside surfaces of the two channels are coated with a conducting material. In either case, the inside surface of the beam channel 42 is preferably coated with a non-oxidizing material such as gold or silver. If local areas of oxidized material are present in the beam channel 42, local variations in the electric field will be generated. These variations cause unpredictable variations in the traectories of the electrons in the electron beam. Hence, a non-oxidizing coating is preferred.

The apparatus of the present invention can be used in either of two modes to create short electron beam pulses. In general, for a given geometric arrangement of the aperture 46 and the structure 44, there will be a range of potentials bounded by $V_{min}$ and $V_{max}$, respectively, which when applied between the linear conductor 52 and the structure 44 will result in the electron beam passing through the aperture 46 and striking the circuit 16. During the time periods in which no electrons are to reach the circuit 16, the linear conductor 52 is held at potential outside this range. For the purpose of this discussion, it will be assumed that it is held at a potential less than the minimum potential, $V_{min}$.

In a first mode of producing an electron beam pulse, the potential on the linear conductor is increased to a value between $V_{min}$ and $V_{max}$ for a short period of time by applying a pulse to the linear conductor 52 with a pulse generator. The minimum width electron beam pulse which may be produced using this mode is limited by the rise time of the pulse applied to the linear conductor 52. The minimum electron beam pulse width is approximately twice the rise time in question. Since it is difficult to produce pulses with rise times of less than 100 picoseconds, an electron beam test probe using this technique is limited in its ability to examine potential variations on the circuit 16 which occur over time frames of less than 200 picoseconds.

In a second mode of producing an electron beam pulse, the potential on the linear conductor is increased from a value less than $V_{min}$ to a value greater than $V_{max}$. During that portion of the potential rise in which the potential is between $V_{min}$ and $V_{max}$, the electron beam will sweep across the aperture 46 and thus be applied to the circuit 16. The shortest time in which the potential may be changed between these two limits depends on the slew rate of the pulse generator used to drive the linear conductor 52. This time will be somewhat less than the rise time of a pulse which starts at $V_{min}$ and stops at $V_{max}$. Hence, this mode provides a substantial improvement over the first mode described above.

This type of sweeping electron beam pulsing scheme has been used with conventional blanking electrodes to produce short electron beam pulses in prior art scanning electron microscope systems. The main problem in implementing this type of pulsing scheme lies in returning the potential to below $V_{min}$ in preparation for the next electron beam pulse. When the potential is reduce from above $V_{max}$ to below $V_{min}$, the electron beam will once again sweep across the aperture 46 and produce an electron beam pulse which is applied to the circuit 16. In principle, one could time this return sweep to coincide with the next electron beam pulse which is to be applied to the circuit. However, in practice this is difficult to achieve, since the shape of the falling potential pulse will in general be different from the shape of the rising potential pulse. This different shape makes it difficult to correlate the electron beam pulse precisely with the test signal pattern applied to the circuit 16. In addition, the electron beam pulses are specified relative to the test signal pattern, not to each other. In general, a delay circuit is preferably used to specify the timing of the electron beam pulse relative to the start of the test signal pattern. A different delay circuit would be needed to specify the timing of the falling potential pulse.

The prior art beam pulsing systems which use this electron beam pulsing technique employ a a separate set of deflection plates to prevent this second electron beam pulse from being generated. This second set of plates causes the electron beam to be deflected in a direction which is perpendicular to the direction in which the electron beam sweeps over the aperture 46. During the time in which the potential is reduced from $V_{max}$ to $V_{min}$, a potential is applied to these deflection plates which causes the electron beam to be deflected such that it passes either above or below the aperture 46, thus preventing the electron beam from passing through the aperture 46 on the return sweep and generating the undesireable second pulse.

The present invention provides a simple means of avoiding this second electron beam pulse which does not require this separate set of deflection plates. The blanking electrode system of the present invention is intended for use in an electron beam test probe system in which a gated detector is used to detect the secondary electrons produced in response to the electron beam bombardment of the circuit. In this type of system, the detector is inhibited from counting secondary electrons which are produced in time periods in which the electron beam is turned off, i.e., between electron beam pulses. Instead of inhibiting the second electron beam pulse by deflecting the electron beam, the present invention uses the circuitry which inhibits the secondary electron counter between electron beam pulses to inhibit said counter during the undesired second electron beam pulse. Hence the deflection plates required in prior art systems are not needed in the present invention.

Various modifications to the present invention will become apparent to those skilled in the art from the foregoing description and accompanying drawings. Such modifications are intended to fall within the scope of the appended claims.

What is claimed is:

1. In an electron beam test probe system for measuring the potential of a selected region on the surface of a specimen, said electron beam test probe system having a means for generating an electron beam, an apparatus for producing a pulsed electron beam comrising:
   beam blocking means including an aperture means defining a region through which said electron beam must pass to reach said specimen;
   means for defining a beam channel through which said electron beam passes prior to passing through the region of space defined by said aperture means and a second channel intersecting said beam channel to form a region common to both said channels, the walls of said beam and second channels being made of a conducting material;
   a linear conductor coaxial with said second channel, said linear conductor and said second channel forming a coaxial transmission line wherein the axis common to said second channel and said linear conductor being positioned such that said electron beam does not intersect said common axis; and
   transmission line driving means coupled to said linear conductor and said second channel for generating a potential between said linear conductor and said second channel;
   wherein an electrostatic deflection field is generated in said first channel when a potential is generated between said linear conductor and said second channel, said electron beam being prevented from passing through said region of space defined by said aperture means unless the potential generated between said linear conductor and said second channel is between predetermined first and second potential values.

2. In an electron beam test probe system for measuring the potential of a selected region on the surface of a specimen, said electron beam test probe system having a means for generating an electron beam, an apparatus for producing a pulsed electron beam comprising:
   beam blocking means including an aperture means defining a region through which said electron beam must pass to reach said specimen;
   means for defining a beam channel through which said electron beam passes prior to passing through the region of space defined by said aperture means and a second channel intersecting said beam channel to form a region common to both said channels, the walls of said beam and second channels being made of a conducting material;
   a linear conductor coaxial with said second channel, said linear conductor and said second channel forming a coaxial transmission line wherein said linear conductor is positioned a predetermined distance from said beam channel; and
   transmission line driving means coupled to said linear conductor and said second channel for generating a potential between said linear conductor and said second channel;
   wherein said electron beam will not pass through said region of space defined by said aperture means unless the potential generated between said linear conductor and said second channel is between predetermined first and second potential values; and
   wherein said beam and second channels are cylindrical, each said channel having a circular cross-section, said beam and second channels intersecting at a substantially right angle, the minimum distance between the axes of said beam and second channels being greater than the radius of the cross-section of the said channel having the largest cross-section.

3. The apparatus of claim 1 wherein said linear conductor is suspended by insulating spacers in said second channel.

4. The apparatus of claim 1 wherein the surface of said beam channel is gold.

5. The apparatus of claim 1 wherein the surface of said beam channel is silver.

6. The apparatus of claim 1 wherein said electron beam test probe system further comprises means for applying a test signal pattern to said specimen and a detector for detecting the secondary electrons produced in response to said electron beam bombarding said specimen, said apparatus further comprising:
   means for causing said transmission line driving means to apply a potential between said linear conductor and said second channel, said potential having a first phase in which said potential passes through said first predetermined potential and then through said second predetermined potential values at first and second predetermined times relative to said test signal pattern and a second phase in which said potential passes through said second predetermined potential and then through said first predetermined potential at third and fourth predetermined times relative to said test signal pattern; and
   means for preventing said secondary electron detector from detecting secondary electrons between said third and fourth predetermined times.

* * * * *